(12) United States Patent
Nakamura (10) Patent No.: US 7,161,392 B2
(45) Date of Patent: Jan. 9, 2007

(54) COMPARATOR FEEDBACK PEAK DETECTOR

(75) Inventor: Atsushi Nakamura, Kumamoto (JP)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/876,161

(22) Filed: Jun. 23, 2004

(65) Prior Publication Data

US 2005/0285633 A1 Dec. 29, 2005

(51) Int. Cl.
*G01R 19/00* (2006.01)
(52) U.S. Cl. .......................... 327/58; 327/73
(58) Field of Classification Search .............. 327/58, 327/59, 60, 61, 62, 73, 75
See application file for complete search history.

(56) References Cited

U.S. PATENT DOCUMENTS

| | | | | |
|---|---|---|---|---|
| 4,219,152 A | * | 8/1980 | Couch et al. | 235/462.27 |
| 4,535,294 A | * | 8/1985 | Ericksen et al. | 327/58 |
| 4,620,444 A | * | 11/1986 | Young | 73/606 |
| 4,737,730 A | * | 4/1988 | Ishiwata et al. | 327/58 |
| 4,939,633 A | * | 7/1990 | Rhodes et al. | 363/98 |
| 5,256,965 A | * | 10/1993 | Nomura | 324/212 |
| 5,412,692 A | * | 5/1995 | Uchida | 375/317 |
| 5,430,370 A | * | 7/1995 | Rooke | 324/207.12 |
| 5,491,434 A | * | 2/1996 | Harnishfeger et al. | 327/50 |
| 5,502,746 A | | 3/1996 | Ozguc | 375/317 |
| 5,801,552 A | * | 9/1998 | Moore | 327/62 |
| 5,880,615 A | | 3/1999 | Bazes | 327/307 |
| 5,923,219 A | * | 7/1999 | Ide et al. | 330/308 |
| 6,107,840 A | * | 8/2000 | Cameron et al. | 327/62 |
| 6,717,574 B1 | * | 4/2004 | Yeh | 345/173 |

OTHER PUBLICATIONS

Askilsrud, Eric et al.; "UPC Reader" EE498 Project; May 22, 1996; www.eee.washington.edu/conselec/Sp96/projects/ajohnson/proposal/project.htm; 6 pages.

* cited by examiner

*Primary Examiner*—Linh My Nguyen
*Assistant Examiner*—Thomas J. Hiltunen
(74) *Attorney, Agent, or Firm*—David J. Rikkers; Foley & Lardner LLP (57) ABSTRACT

There is disclosed a circuit and a process for detecting peak-to-peak voltage. The circuit comprises a first comparator having an output coupled to a first capacitor, a non-inverting input for receiving a high frequency AC waveform, and an inverting input, a second comparator having an output coupled to a second capacitor, and a first second input, an operational amplifier having a non-inverting input coupled to the inverting input of the first comparator, and an inverting input coupled to the first input. The process comprises charging a first capacitor when a high frequency AC waveform voltage is greater than a buffered voltage of the first capacitor, charging a second capacitor when an inverted buffered voltage of the second capacitor is greater than the high frequency AC waveform voltage, and outputting a voltage based on the buffered voltage of the first capacitor and the inverted buffered voltage of the second capacitor.

14 Claims, 4 Drawing Sheets

COMPARATOR FEEDBACK PEAK DETECTOR

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by any one of the patent disclosure as it appears in the Patent and Trademark Office patent files or records, but otherwise reserves all copyright and trade dress rights whatsoever.

BACKGROUND OF THE INVENTION

1. Field of the Invention

The present invention relates to peak-to-peak voltage measurement of AC waveforms.

2. Description of the Related Art

Manufacturers often test both their electronic systems and their components prior to shipping the electronic systems to customers. Electronic systems and components are also tested during rework and repair. Electrical testing is typically performed with digital and/or analog logic devices.

Logic devices, inherently, have a limited switching speed based on dielectric material, internal resistance, capacitance, and inductance. Semiconductor designers have focused on improving power dissipation and propagation delay. Power dissipation refers to the power consumed by a logic device when it operates. Propagation delay refers to the average time it takes a logic device to provide an output after receiving an input signal.

As demand for faster switching speeds has grown, semiconductor technology has progressed. For example, traditional Diode Logic, Resistor-Transistor Logic, and Diode-Transistor Logic have been replaced by common Transistor-Transistor Logic (TTL). TTL technology has been widely used for approximately 20 years as a building block for logic circuitry. Schottky, Low-power Schottky, Advanced Schottky, and Advanced Low-power Schottky family TTL devices typically exhibit propagation delay of 3, 9, 1.5, and 4 ns respectively and power dissipation of 18, 2, 10, and 1 mW per gate, respectively. For today's highest speed applications, designers use Emitter Coupled Logic (ECL), which typically exhibits characteristics of 0.5–2 ns propagation delay, and 25 mW power dissipation per gate.

DETAILED DESCRIPTION OF THE INVENTION

Throughout this description, the embodiments and examples shown should be considered as exemplars, rather than limitations on the apparatus and methods of the present invention.

Figure 1:
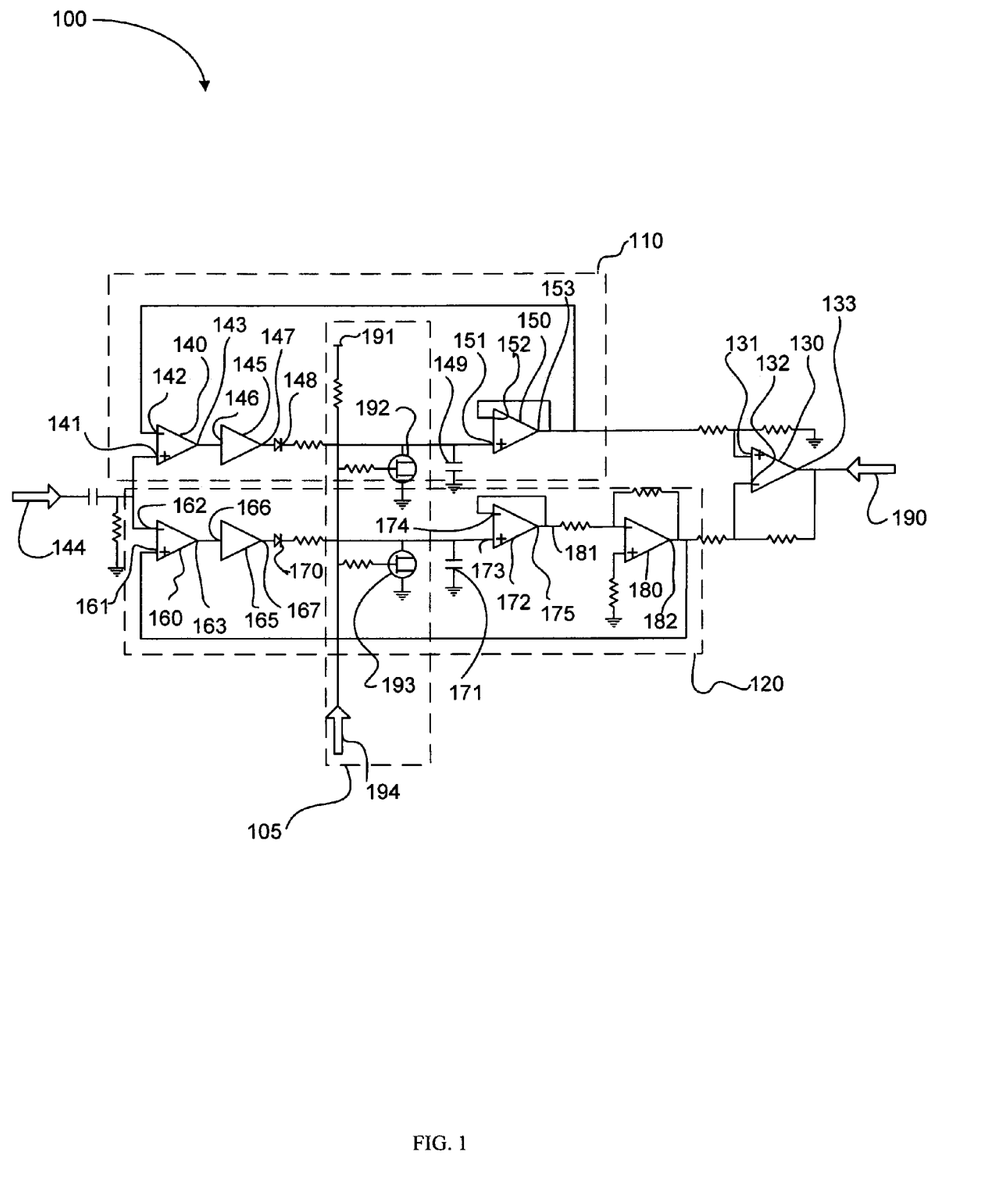
FIG. 1 illustrates one embodiment of a high speed peak-to-peak detector according to the present invention.

Referring now to FIG. 1, there is shown a simplified circuit diagram of a high speed peak-to-peak detector 100. The high speed peak-to-peak detector 100 may measure peak-to-peak voltage of a high frequency AC waveform. Peak-to-peak voltage refers to the difference in magnitude of the maximum voltage and the minimum voltage of the high frequency AC waveform. High frequency refers to frequencies greater than 10 MHz. AC refers to alternating current. Waveform refers to voltage of an electrical signal as a function of time. High speed refers to ability of the high speed peak-to-peak detector 100 to provide an accurate measurement of the high frequency AC waveform in less than 2 μs. An accurate measurement has a maximum error within +/−(1.9 dB+5 mV) of the peak-to-peak voltage when the peak-to-peak voltage is approximately 2.048V. The high speed peak-to-peak detector may be installed in a digital semiconductor tester, an analog computer, a handheld signal analyzer, or other.

The high speed peak-to-peak detector 100 may include a positive peak subcircuit 110, a negative peak subcircuit 120, an operational amplifier 130, and a reset subcircuit 105. The positive peak subcircuit 110 may include a first comparator 140, a first translator 145, a first high speed diode 148, a first capacitor 149 and a first buffer amplifier 150.

The first comparator 140 may be high speed comparator. A high speed comparator is characterized by a propagation rate of approximately 2.5 ns or less. High speed comparators include ECL technology comparators, such as ECL, Positive ECL (PECL), Low Voltage Positive ECL (LVPECL), Negative ECL (NECL), and Low Voltage Negative ECL (LVNECL). However, high speed comparators are not limited to ECL techologies. An example of a high speed comparator is the MAX9691 manufactured by Maxim Integrated Products.

ECL comparators may be powered by a single power supply or dual power supplies. ECL comparators powered by a dual power supply, or dual power rail, exhibit faster propagation rates than single power rail ECL comparators. For high bandwidth applications, where signals exhibit high frequencies, the first comparator 140 should include dual power rails.

The first comparator 140 may include a non-inverting input 141, an inverting input 142, and an output 143. The first comparator 140 may receive analog input signals at the non-inverting input 141 and the non-inverting input 142. If the signal received at the non-inverting input 141 is higher in voltage than the signal received at the inverting input 142, then the first comparator 140 outputs a logic high voltage at the output 143, else the first comparator 140 outputs a logic low voltage at the output 143. Typical logic levels for ECL logic are −0.95V to −0.7V for logic high and −1.9V to −1.6V for logic low.

At high frequencies, for example, greater than 10 MHz, high speed comparators perform with greater accuracy and faster speed than standard operational amplifiers that are configured with diodes to perform a peak detector function. High speed comparators, unlike standard operational amplifiers do not suffer from slow propagation due to saturation. High speed comparators exhibit the ability to accurately measure smaller voltages than standard operational amplifiers configured with diodes to perform a peak detector function. Moreover, high speed comparators function with greater accuracy with regard to varying crest factors of waveforms than standard operational amplifiers configured with diodes to perform a peak detector function.

The non-inverting input 141 of the first comparator 140 may receive a voltage of an AC waveform from a voltage input 144. The AC waveform may exhibit a frequency of, for example, 150 kHz, 1 MHz, or 50 MHz.

The first translator 145 may include an input 146 and an output 147. The input 146 of the first translator 145 may be coupled to the output 143 of the first comparator 140. The first translator 145 may level shift the voltage provided from the output 145 of the first comparator 140. The level shift may be from ECL to TTL logic levels. Typical TTL logic levels include 0V to 0.4V for logic low and 2.4V to 5V for logic high. The first translator 145 may be omitted from the positive peak subcircuit 110 if the first comparator 140 provides a TTL or CMOS level output voltage.

The first high speed diode 148 may be coupled to the output 148 of the first translator 145. The first high speed diode 148 may have a fast propagation rate. An example of a high speed diode is a Schottky diode. A Schottky diode has the ability to switch at high frequencies without degrading the amplitude of the signal passing through it. The first high speed diode 148 may be selected to allow a signal to pass through the first high speed diode 148 only when the signal has at least a TTL logic high voltage.

The first capacitor 149 may be coupled between the first high speed diode 148 and ground. The term ground refers to an electrical sink having a zero voltage. A sink may have a zero voltage or other common voltage. When the first comparator 140 outputs a logic high voltage, the translator 145 will output a TTL logic high voltage that passes through the first high speed diode 148 and charges the first capacitor 149. When the first comparator 140 outputs a logic low voltage, the translator will output a TTL logic low voltage which will not pass through the first high speed diode 148. The first high speed diode 148 may prevent current from flowing from the first capacitor 149 to the output 148 of the first translator 145.

The first buffer amplifier may include a non-inverting input 151, an inverting input 152 and an output 153. The non-inverting input 151 of the first buffer amplifier 150 may be coupled between the first high speed diode 148 and the first capacitor 149. The output 153 of the first buffer amplifier 150 may be coupled to the inverting input 152 of the first buffer amplifier 150 and the inverting input 142 of the first comparator 140.

The first buffer amplifier 150 may be an operational amplifier which exhibits a high input impedance and a low output impedance. Because of the high input impedance, the first capacitor 149 will exhibit minimal or no discharge from through the first buffer amplifier 150. The first buffer amplifier 150 isolates the components coupled to the non-inverting input 151 of the first buffer amplifier 150 from the output 153 of the first buffer amplifier because the non-inverting input 151 of the first buffer amplifier 150 has an impedance on the order of $10^{12}$ ohms. Because of the low output impedance and high power gain, the first buffer amplifier 150 may output a signal having substantially the same voltage as the first capacitor 149 to several components via the output 153 of the first buffer amplifier 150.

The first comparator 140 will output a logic high voltage when the voltage of the AC waveform at the non-inverting input 141 of the first comparator 142 is greater than the buffered voltage of the first capacitor 149 at the inverting input 142 of the first comparator 140.

The first capacitor 149 exhibits a characteristic called slew rate. Slew rate is the maximum change in voltage relative to time, typically measured in V/μs. If the AC waveform exhibits a frequency that is very fast, the slew rate of the first capacitor 149 may cause the first capacitor 149 to charge only partially to the peak positive voltage of the AC waveform during the first positive cycle of the AC waveform. Therefore, the first capacitor 149 may require more than one cycle of the AC waveform to charge to the peak voltage of the AC waveform.

The negative peak subcircuit 120 may include a second comparator 160, a second translator 165, a second high speed diode 170, a second capacitor 171, a second buffer amplifier 172, and an inverting amplifier 180.

The second comparator 160 may include a non-inverting input 161, an inverting input 162, and an output 163. The second comparator 160 may receive analog input signals at the non-inverting input 161 and the inverting input 162. If the signal received at the non-inverting input 161 is higher in voltage than the signal received at the inverting input 142, then the second comparator 160 outputs a logic high voltage at the output 163.

The inverting input 142 of the second comparator 160 may be coupled to the non-inverting input 141 of the first comparator 140. The inverting input 142 of the second high speed comparator may receive the voltage of the AC waveform from the voltage input 144.

The second translator 165 may include an input 166 and an output 167. The input 166 of the second translator 165 may be coupled to the output 163 of the second comparator 160. The second translator 165 may level shift the voltage provided from the output 163 of the second comparator 160.

The second high speed diode 170 may be coupled between the output 167 of the second translator 165 and the second capacitor 171. The second capacitor may be coupled between the second high speed diode 170 and ground. When the second comparator 160 outputs a logic high voltage, the second translator 165 will output a TTL logic high voltage that passes through the second high speed diode 170 and charges the second capacitor 171. When the second comparator 160 outputs a logic low voltage, the second translator 165 will output TTL logic low voltage which will not pass through the second high speed diode 171.

The second buffer amplifier 172 may include a non-inverting input 173, an inverting input 174, and an output 175. The non-inverting input 173 of the second buffer amplifier 172 may be coupled between the second high speed diode 170 and the second capacitor 171. The output 175 of the second buffer amplifier 172 may be coupled to the inverting input 174 of the second buffer amplifier 174.

The inverting amplifier 180 may include an input 181 and an output 182. The inverting amplifier 180 may be an operational amplifier. The inverting amplifier 180 may provide a voltage at the output 182 of the inverting amplifier 180 that is the negative of the voltage at the input 181 of the inverting amplifier 180. The output 182 of the inverting amplifier 180 may be coupled to the non-inverting input 161 of the second comparator 160.

The second high speed comparator will output a logic high voltage when the inverted buffered voltage of the second capacitor 171 is greater than the voltage of the AC waveform at the inverting input 162 of the second high speed comparator.

The operational amplifier 130 may be configured as differential amplifier, a multiplying amplifier, a dividing amplifier, or a summing amplifier. As shown in FIG. 1, the operational amplifier is configured as a differential amplifier. A differential amplifier outputs the difference in the voltages at the inputs of the differential amplifier.

The operational amplifier 130 may include a non-inverting input 131, an inverting input 132, and an output 133. The non-inverting input 131 of the operational amplifier 130 may be coupled to the output 153 of the first buffer amplifier 150. The inverting input 132 of the operational amplifier 130 may be coupled to the output 182 of the inverting amplifier 180. To function as a differential amplifier, the coupling of the non-inverting input 131 of the operational amplifier 130 with the output 153 of the first buffer amplifier and the coupling of the inverting input 132 of the operational amplifier 130 and the output 182 of the inverting amplifier 180 each include a resistor of common resistance.

The operational amplifier 130 will output a voltage at the output 133 of the operational amplifier 130 that is the difference between the buffered voltage of the first capacitor 149 at the non-inverting input 131 of the operational amplifier 130 and the inverted buffered voltage of the second capacitor 172 at the inverting input 132 of the operational amplifier 130. The voltage at the output 133 of the operational amplifier 130 may be provided to an input 190 of a digitizer, a conventional voltmeter, or other.

The reset subcircuit 105 may include a ground 191, a first high speed switch 192, a second high speed switch 193, and a trigger 194. The trigger 194 may be coupled to the ground 191, the first high speed switch 192, and the second high speed switch 193. The trigger 194 may be a button, a computer controlled logic circuit, or other.

The first high speed switch 192 may be coupled between the non-inverting input 152 of the first buffer amplifier 150 and the ground 191. The second high speed switch 193 may be coupled between the non-inverting input 173 of the second buffer amplifier 172 and the ground 191. The first high speed switch 192 and the second high speed switch 193 may be FET switches or other switches. When the trigger 194 is activated, the first high speed switch 192 causes the first capacitor 149 to discharge to the ground 191. Additionally, when the trigger 194 is activated, the second high speed switch 193 causes the second capacitor 171 to discharge to the ground 191. By using FET switches, discharge of the capacitors may be accomplished rapidly, for example, in 1 μs.

The peak-to-peak detector 100 of FIG. 1 may provide the ability to accurately test the amplitude of AC waveforms of high frequencies. The speed characteristics of the peak-to-peak detector 100 may allow for accurate testing of a waveform at a minimum pulse width of 2.5 ns. As configured in FIG. 1, the output slew rate of the peak-to-peak detector 100 may be 1 V/μs and the droop rate may be less than 1 mV/μs. Moreover, the peak-to-peak detector 100 may be accurately used from frequencies of 150 kHz to at least 75 MHz.

Some semiconductors, for example processors which control optics and servo motors of a compact disk or digital video disk drive, function at high frequencies. Manufacturers of semiconductors which function at high speed desire to test the peak-to-peak voltage of signals interacting with the semiconductors. The testing may occur at high frequencies. The peak-to-peak detector 100, unlike common digitizers with digital signal processing (DSP) technologies, is able to meet the current bandwidth requirements using analog circuitry.

Figure 2:
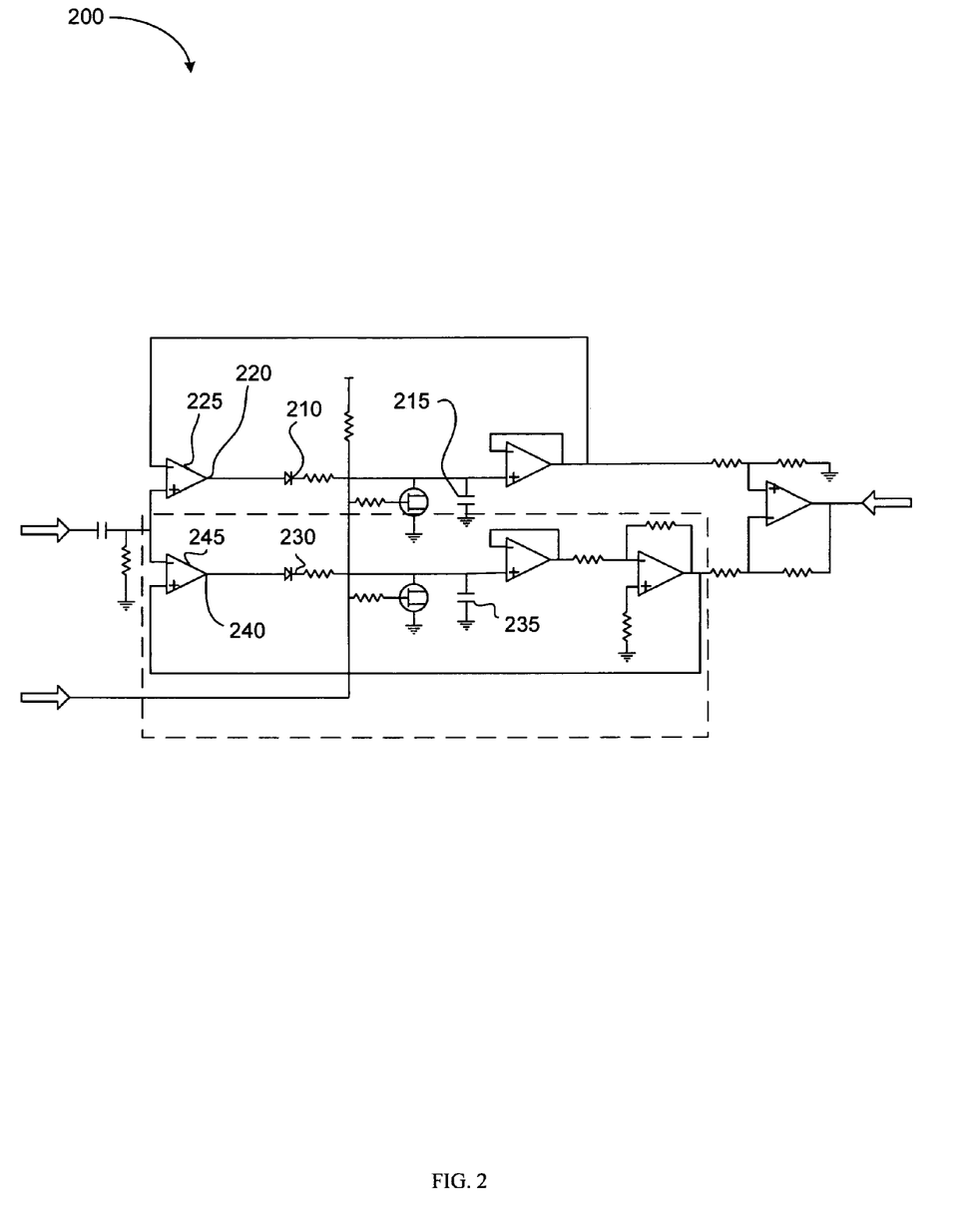
FIG. 2 illustrates another embodiment of the high speed peak-to-peak detector according to the present invention.

Referring now to FIG. 2, there is shown a simplified circuit diagram of a high speed peak-to-peak detector 200. In this embodiment, the high speed peak-to-peak detector 200 does not include translators. The first high speed diode 210 is coupled between the first capacitor 215 and the output 220 of the first comparator 225. The second high speed diode 230 is coupled between the second capacitor 235 and the output 240 of the second comparator 245.

The first comparator 225 and second comparator 245 may be high speed comparators with TTL outputs, or other. The first high speed diode 215 and the second high speed diode 230 may be selected to allow the high logic state output signal of the high speed comparators to pass through the high speed diodes and the low logic state output signal of the high speed comparators not to pass.

Figure 3:
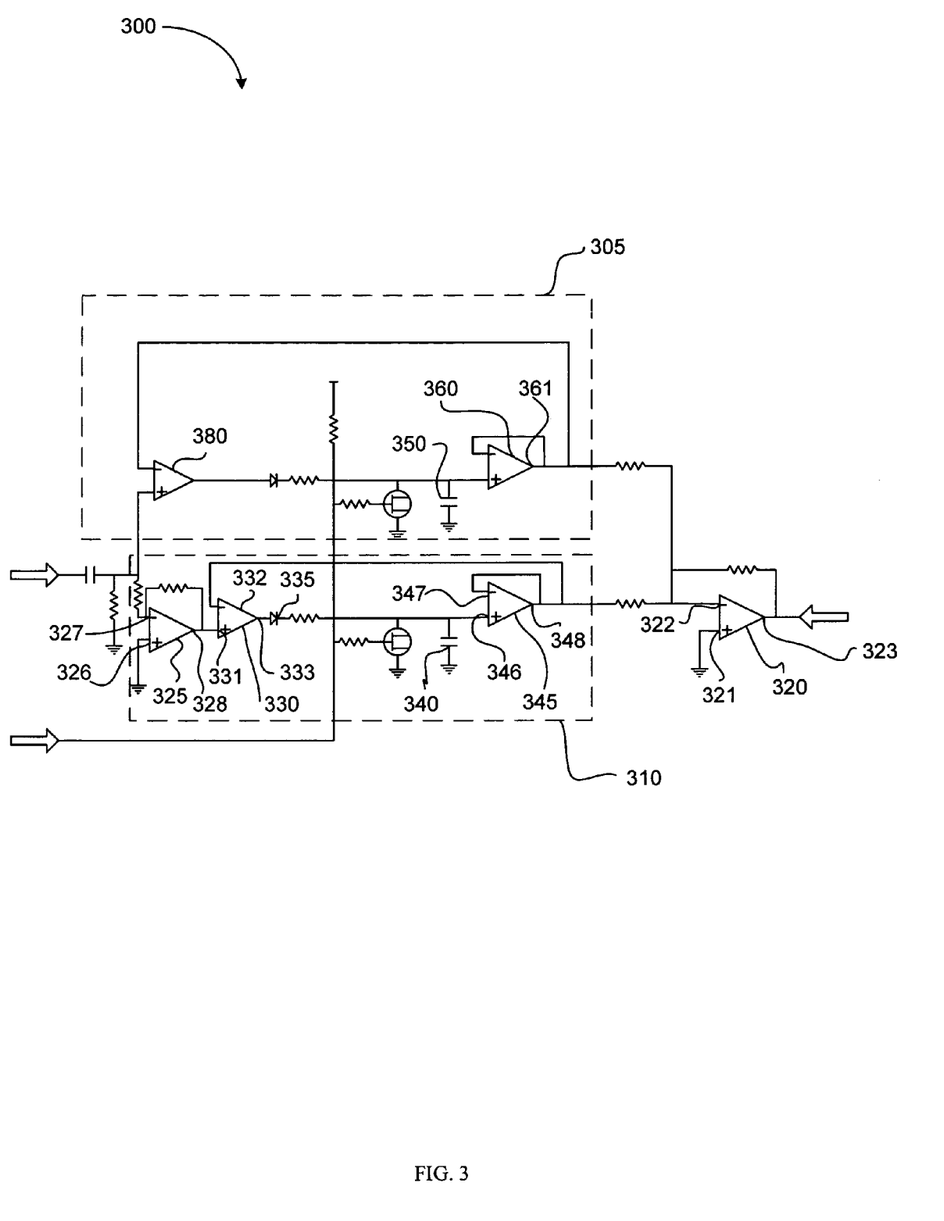
FIG. 3 illustrates yet another embodiment of the high speed peak-to-peak detector according to the present invention.

Referring now to FIG. 3, there is shown a simplified circuit diagram of a high speed peak-to-peak detector 300. The high speed peak-to-peak detector may include a positive peak subcircuit 305, a negative peak subcircuit 310, and an operational amplifier 320. In this embodiment, the negative peak subcircuit 310 is configured such that the AC waveform is inverted prior to introduction to the second high speed comparator. Moreover, the operational amplifier 320 is configured as a summing amplifier.

The negative peak subcircuit 310 includes an inverting amplifier 325, a second comparator 330, a second high speed diode 335, a second capacitor 340, and second buffer amplifier.

The inverting amplifier 325 includes a non-inverting input 326, an inverting input 327, and an output 328. The non-inverting input 326 of the inverting amplifier 325 is coupled to ground. The inverting input 327 of the inverting amplifier 325 may be coupled to the non-inverting input 381 of the first comparator 380. The inverting input 327 of the inverting amplifier 325 may receive the AC waveform. The inverting amplifier 325 may output the negative of the voltage of the AC waveform at the output 328 of the inverting amplifier.

The second comparator 330 may include a non-inverting input 331, an inverting input 332, and an output 333. The non-inverting input 331 of the second comparator 330 may be coupled to the output 328 of the inverting amplifier 325.

The second high speed diode 335 may be coupled between the second capacitor 340 and the output 333 of the second high speed comparator. The second capacitor 340 may be coupled between the second high speed diode 335 and ground.

The second buffer amplifier 345 may include a non-inverting input 346, in inverting input 367, and an output 348. The non-inverting input 346 of the second buffer amplifier 345 may be coupled between the second high speed diode 335 and the second capacitor 340. The output 348 of the second buffer amplifier may be coupled to the inverting input 347 of the second buffer amplifier 345. The output 348 of the second buffer amplifier may also be coupled to the inverting input 332 of the second comparator 333.

The second comparator 330 will cause the second capacitor 340 to charge when the inverted voltage of the AC waveform at the non-inverting input 331 of the second comparator 330 is greater than the buffered voltage of the second capacitor 340 at the inverting input 332 of the second comparator 333.

The operational amplifier 320 may be configured as a summing amplifier. The operational amplifier may include a non-inverting input 321, an inverting input 322, and an output 323. The non-inverting input 321 of the operational amplifier 320 may be coupled to ground. The output 323 of the operational amplifier 320 may be coupled to the inverting input 211 of the operational amplifier. The inverting input 211 of the operational amplifier may also be coupled to the output 348 of the second buffer amplifier 345 and the output 361 of the first buffer amplifier 360. To function as a summing amplifier, the coupling of the inverting input 322 of the operational amplifier to each of the output 323 of the operational amplifier, the output 348 of the second buffer amplifier 345, and the output 361 of the first buffer amplifier 360 will include a resistor having a common value. The output 323 of the operational amplifier 320 will be the negative of the voltage of the sum of the buffered voltage of the first capacitor 350 and the buffered voltage of the second capacitor 340.

The peak-to-peak voltage detectors described herein may be used in automated test equipment. Typical automated test equipment (ATE) utilize DSP to measure amplitude, harmonics, and noise of electrical signals. ATE is typically used to test digital integrated circuits, linear and mixed-signal integrated circuits, and microwave devices.

Figure 4:
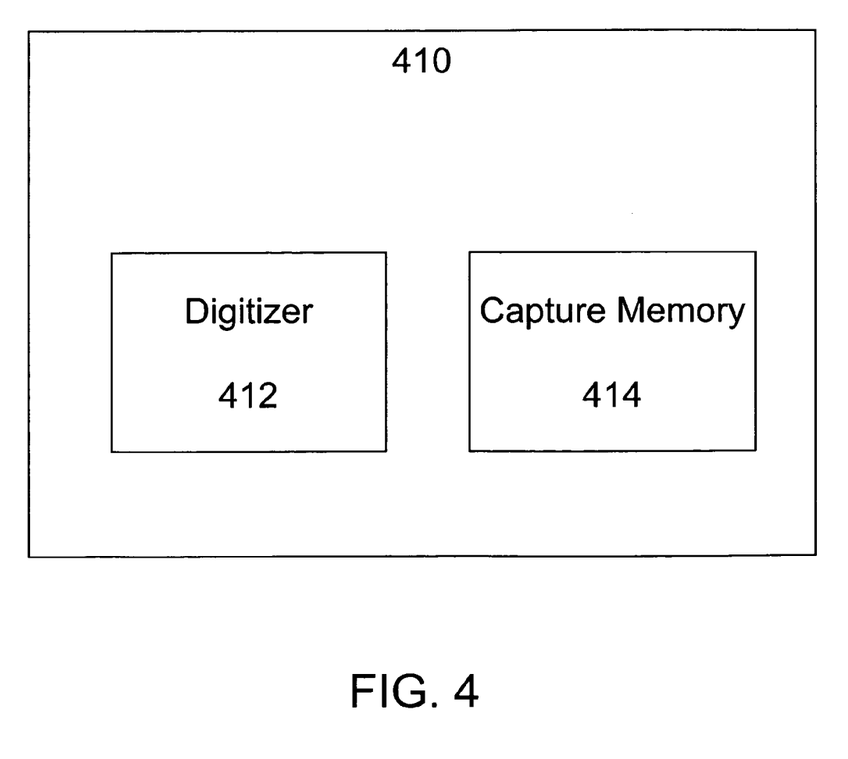
FIG. 4 is a block diagram of automated testing equipment associated with an embodiment of the present invention.

With reference to FIG. 4, the ATE 410 may send an electric pulse at a programmed interval to the trigger. The electric pulse may cause the trigger to activate at a fixed interval causing the capacitors to periodically discharge. The ATE 410 may include a digitizer 412 which converts the output of the operational amplifier to a digital signal. The ATE 410 may include a capture memory 414. The capture memory 414 may record and store the digital signal over a period of time. Based on the digital signal and time data stored in the capture memory 414, the ATE 410 may calculate the envelope of the waveform either with or without averaging.

Although exemplary embodiments of the present invention have been shown and described, it will be apparent to those having ordinary skill in the art that a number of changes, modifications, or alterations to the invention as described herein may be made, none of which depart from the spirit of the present invention. All such changes, modifications and alterations should therefore be seen as within the scope of the present invention.

It is claimed:

1. A circuit comprising:
a first capacitor
a first comparator having
   an output coupled to the first capacitor
   a non-inverting input for receiving a high frequency AC waveform
   an inverting input
a second capacitor
a second comparator having
   an output coupled to the second capacitor
   a first input
   a second input
a first buffer amplifier having
   an input coupled to the first capacitor
   an output coupled to the inverting input of the first comparator
a second buffer amplifier having
   an input coupled to the second capacitor
   an output
an inverting amplifier having
   an input coupled to the output of the second buffer amplifier
   an output coupled to the first input of the second comparator
an operational amplifier having
   a non-inverting input coupled to the inverting input of the first comparator and the output of the first buffer amplifier
   an inverting input coupled to the first input of the second comparator and the output of the inverting amplifier.

2. The circuit of claim 1, further comprising:
a first high speed diode coupled between the first capacitor and the output of the first comparator
a second high speed diode coupled between the second capacitor and the output of the second comparator.

3. The circuit of claim 2, wherein:
the first input is an non-inverting input for receiving an inverted buffered voltage of the second capacitor
the second input is an inverting input for receiving the high frequency AC waveform,
the second input is coupled to the non-inverting input of the first comparator.

4. A circuit comprising:
a first capacitor
a first comparator having
   an output coupled to the first capacitor
   a non-inverting input for receiving a high frequency AC waveform
   an inverting input
a second capacitor
a second comparator having
   an output coupled to the second capacitor
   a first input
   a second input
a first high speed diode coupled between the first capacitor and the output of the first comparator
a second high speed diode coupled between the second capacitor and the output of the second comparator
a first buffer amplifier having
   an input coupled to the first capacitor
   an output coupled to the inverting input of the first comparator
a second buffer amplifier having
   an input coupled to the second capacitor
   an output
an inverting amplifier having
   an input coupled to the output of the second buffer amplifier
   an output coupled to the first input
an operational amplifier having
   a non-inverting input coupled to the inverting input of the first comparator
   an inverting input coupled to the first input
wherein the first input is an non-inverting input for receiving an inverted buffered voltage of the second capacitor
wherein the second input is an inverting input for receiving the high frequency AC waveform
wherein the second input is coupled to the non-inverting input of the first comparator.

5. The circuit of claim 4, wherein the comparators are high speed comparators.

6. The circuit of claim 4, further comprising:
for each comparator, an ECL-TTL translator coupled between the comparator and the capacitor, wherein the comparators are ECL comparators.

7. The circuit of claim 4, further comprising:
a first FET switch coupled between the first capacitor and a sink, the first FET switch for discharging the first capacitor when the first FET switch receives a RESET signal
a second FET switch coupled between the second capacitor and the sink, the second FET switch for discharging the second capacitor when the second FET switch receives the RESET signal.

8. The circuit of claim 2, wherein:
the first input is an inverting input for receiving a buffered voltage of the second capacitor
the second input is a non-inverting input for receiving an inverted high frequency AC waveform.

9. The circuit of claim 8, wherein the comparators are high speed comparators.

10. A circuit comprising:
a first capacitor
a first comparator having
    an output coupled to the first capacitor
    a non-inverting input for receiving a high frequency AC waveform
    an inverting input
a second capacitor
a second comparator having
    an output coupled to the second capacitor
    a first input
    a second input
an operational amplifier having
    a non-inverting input coupled to the inverting input of the first comparator
    an inverting input coupled to the first input
a first high speed diode coupled between the first capacitor and the output of the first comparator
a second high speed diode coupled between the second capacitor and the output of the second comparator
a first buffer amplifier having
    an input coupled to the first capacitor
    an output coupled to the inverting input of the first comparator
a second buffer amplifier having
    an input coupled to the second capacitor
    an output coupled to the first input
an inverting amplifier having
    an input coupled to tenon-inverting input of the first comparator
    an output coupled to the second input
for each comparator, an ECL-TTL translator coupled between the comparator and the capacitor, wherein the comparators are ECL comparators
wherein the first input is an inverting input for receiving a buffered voltage of the second capacitor
wherein the second input is a non-inverting input for receiving an inverted high frequency AC waveform.

11. The circuit of claim 8, further comprising:
a first FET switch coupled between the first capacitor and a sink, the first FET switch for discharging the first capacitor when the first FET switch receives a RESET signal
a second FET switch coupled between the second capacitor and the sink, the second FET switch for discharging the second capacitor when the second FET switch receives the RESET signal.

12. The circuit of claim 2, wherein the operational amplifier further comprises an output coupled with a digitizer of an automated testing system.

13. The circuit of claim 11, further comprising an automated testing system, the automated testing system comprising a digitizer and a capture memory, the digitizer coupled with an output of the operational amplifier, the capture memory coupled with the digitizer, wherein the RESET signal is a periodic pulse having a fixed interval.

14. An automated testing system including the circuit of claim 7.

* * * * *

UNITED STATES PATENT AND TRADEMARK OFFICE
CERTIFICATE OF CORRECTION

PATENT NO. : 7,161,392 B2
APPLICATION NO. : 10/876161
DATED : January 9, 2007
INVENTOR(S) : Atsushi Nakamura

It is certified that error appears in the above-identified patent and that said Letters Patent is hereby corrected as shown below:

At Column 10, line 7, Claim 10 currently reads as follows:
"an input coupled to tenon-inverting input of the first"

At Column 10, line 7, please correct Claim 10 to read as follows:
-- an input coupled to the non-inverting input of the first --

Signed and Sealed this

Thirty-first Day of July, 2007

JON W. DUDAS
*Director of the United States Patent and Trademark Office*